(12) United States Patent
Deshmukh et al.

(10) Patent No.: US 9,721,802 B2
(45) Date of Patent: Aug. 1, 2017

(54) LED BASED OPTICAL SOURCE COUPLED WITH PLASMA SOURCE

(71) Applicant: Applied Materials, Inc., Santa Clara, CA (US)

(72) Inventors: Subhash Deshmukh, Livermore, CA (US); Joseph Johnson, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 128 days.

(21) Appl. No.: 14/290,856

(22) Filed: May 29, 2014

(65) Prior Publication Data

US 2015/0096683 A1 Apr. 9, 2015

Related U.S. Application Data

(60) Provisional application No. 61/887,830, filed on Oct. 7, 2013, provisional application No. 61/886,521, filed on Oct. 3, 2013.

(51) Int. Cl.
| | |
|---|---|
| *C23C 16/00* | (2006.01) |
| *C23F 1/00* | (2006.01) |
| *H01L 21/306* | (2006.01) |
| *H01L 21/3065* | (2006.01) |
| *H01J 37/32* | (2006.01) |
| *C23F 4/00* | (2006.01) |
| *H01L 21/311* | (2006.01) |

(Continued)

(52) U.S. Cl.
CPC ............ *H01L 21/3065* (2013.01); *C23F 4/00* (2013.01); *H01J 37/321* (2013.01); *H01J 37/32146* (2013.01); *H01J 37/32862* (2013.01); *H01L 21/02071* (2013.01); *H01L 21/268* (2013.01); *H01L 21/2686* (2013.01); *H01L 21/31116* (2013.01); *H01L 21/32135* (2013.01); *H01L 21/32136* (2013.01); *H05K 3/027* (2013.01); *H01J 2237/3343* (2013.01)

(58) Field of Classification Search
CPC ..................... H01L 21/3065; H01L 21/32145
USPC ..................................... 156/345.28
See application file for complete search history.

(56) References Cited

U.S. PATENT DOCUMENTS

| | | | |
|---|---|---|---|
| 4,490,211 A | 12/1984 | Chen et al. | |
| 5,005,519 A | * 4/1991 | Egermeier | ............ C23C 16/488 |
| | | | 118/50.1 |

(Continued)

FOREIGN PATENT DOCUMENTS

| | | |
|---|---|---|
| JP | 2002329961 A | 11/2002 |
| KR | 10-0275534 B1 | 12/2000 |

(Continued)

OTHER PUBLICATIONS

English translation KR 2001-0058535, Ahn et al., Jul. 2001.*

(Continued)

*Primary Examiner* — Keath Chen
(74) *Attorney, Agent, or Firm* — Kilpatrick Townsend & Stockton LLP

(57) ABSTRACT

An apparatus configured to remove metal etch byproducts from the surface of substrates and from the interior of a substrate processing chamber. A plasma is used in combination with a solid state light source, such as an LED, to desorb metal etch byproducts. The desorbed byproducts may then be removed from the chamber.

18 Claims, 4 Drawing Sheets

(51) Int. Cl.
H01L 21/3213 (2006.01)
H05K 3/02 (2006.01)
H01L 21/268 (2006.01)
H01L 21/02 (2006.01)

(56) References Cited

U.S. PATENT DOCUMENTS

| | | | | |
|---|---|---|---|---|
| 5,487,127 | A * | 1/1996 | Gronet | C23C 16/481 118/50.1 |
| 5,879,574 | A * | 3/1999 | Sivaramakrishnan | C23C 16/4405 134/1.1 |
| 6,214,162 | B1 * | 4/2001 | Koshimizu | H01J 37/321 |
| 6,407,001 | B1 | 6/2002 | Scott | |
| 6,569,775 | B1 * | 5/2003 | Loewenhardt | H01L 21/32136 156/345.24 |
| 6,734,102 | B2 | 5/2004 | Rathi et al. | |
| 6,933,182 | B1 * | 8/2005 | Yamazaki | H01L 21/3003 257/E21.134 |
| 7,501,355 | B2 | 3/2009 | Bhatia et al. | |
| 7,732,793 | B2 | 6/2010 | Ershov et al. | |
| 7,947,584 | B2 | 5/2011 | Moffatt | |
| 2003/0082412 | A1 * | 5/2003 | Fukuda | C23C 4/10 428/697 |
| 2003/0228415 | A1 * | 12/2003 | Bi | C23C 16/402 427/180 |
| 2008/0063809 | A1 * | 3/2008 | Lee | H01L 21/3105 427/558 |
| 2008/0073222 | A1 * | 3/2008 | Yamauchi | C23C 8/40 205/655 |
| 2010/0190098 | A1 | 7/2010 | Walker et al. | |
| 2010/0267174 | A1 | 10/2010 | Moffatt | |
| 2011/0146909 | A1 | 6/2011 | Shih et al. | |
| 2013/0267096 | A1 * | 10/2013 | Hawryluk | H01J 37/32082 438/710 |
| 2014/0263180 | A1 * | 9/2014 | Moffatt | C23C 16/48 216/62 |
| 2014/0273504 | A1 * | 9/2014 | Nainani | H01L 21/02277 438/758 |
| 2015/0099369 | A1 | 4/2015 | Deshmukh et al. | |
| 2015/0235847 | A1 * | 8/2015 | Beasley | H01L 21/02527 427/535 |
| 2015/0380265 | A1 * | 12/2015 | Yim | H01L 21/02126 438/781 |

FOREIGN PATENT DOCUMENTS

| | | |
|---|---|---|
| KR | 2001-0058535 A | 7/2001 |
| KR | 2005-0059451 A | 6/2005 |
| TW | 201519312 A | 5/2015 |
| WO | 2015050715 A1 | 4/2015 |
| WO | 2015050716 A1 | 4/2015 |

OTHER PUBLICATIONS

English translation, KR 10-0275534, Baek et al. Feb. 2000.*
International Search Report and Written Opinion dated Dec. 30, 2014 for International Application No. PCT/US2014/056393, 27 pages.
Hahn et al., "Dry etching mechanism of copper and magnetic materials with UV illumination", *Materials Science and Engineering* B79 (2001) 20-26.
U.S. Appl. No. 14/290,861, "Non Final Office Action", Aug. 7, 2015, 12 pages.
U.S. Appl. No. 14/290,861, "Notice of Allowance", Jan. 29, 2016, 8 pages.
Choi, et al., "Low Temperature Copper Etching Using an Inductively Coupled Plasma with Ultraviolet Light Irradiation", J. Electrochem. Soc., vol. 145, No. 3, 1998, pp. L37-L39.
PCT/US2014/056352, "International Search Report and Written Opinion", Dec. 30, 2014, 16 pages.
CN201480056680.7, "Notification for Rectification", May 9, 2016, 1 page.
PCT/US2014/056352, "International Preliminary Report on Patentability", Apr. 14, 2016, 8 pages.
PCT/US2014/056393, "International Preliminary Report on Patentability", Apr. 14, 2016, 8 pages.
U.S. Appl. No. 14/290,861, "Non-Final Office Action", Jun. 9, 2016, 12 pages.
U.S. Appl. No. 14/290,861, "Notice of Allowance", Oct. 11, 2016, 8 pages.
U.S. Appl. No. 14/290,861, "Supplemental Notice of Allowance", Oct. 28, 2016, 4 pages.

* cited by examiner

LED BASED OPTICAL SOURCE COUPLED WITH PLASMA SOURCE

CROSS-REFERENCES TO RELATED APPLICATIONS

This application claims priority to Provisional Application No. 61/886,521, filed Oct. 3, 2013, titled "LED BASED OPTICAL SOURCE COUPLED WITH PLASMA SOURCE" and Provisional Application No. 61/887,830, filed Oct. 7, 2013, titled "APPARATUS FOR ETCHING SUBSTRATES PRODUCING NON-VOLATILE BYPRODUCTS USING COMBINATION OF PLASMA AND LED SOURCES", which are hereby incorporated by reference in their entirety.

BACKGROUND OF THE INVENTION

The use of metals such as copper and cobalt as a conductive interconnect material is favored in semiconductor devices because of the high electrical conductivities and circuit speeds these metals enable. On the other hand, such metals are difficult to pattern. As such, copper interconnect leads have predominantly heretofore been formed using damascene and dual damascene processing technology whereby openings are formed in a dielectric layer on a substrate such as a semiconductor substrate used to form semiconductor devices. Copper is deposited over the dielectric layer and within the openings. Polishing/planarization removes copper from over the dielectric leaving the copper inlaid within the openings. In this way, the burden on photolithography is shifted from copper to the more manageable dielectric layer. The inlaid copper includes an upper surface that is essentially co-planar with the top surface of the patterned dielectric layer in which the copper is formed.

Subtractive metal etching is an alternative to a damascene process flow. A contiguous layer of metal is deposited and then patterned to form horizontal electrical interconnections. One process employed to perform subtractive metal etching uses a plasma. The plasma selectively removes the metal, however it may redeposit metal-containing residues on the substrate as well as within the processing chamber. Such residues can be difficult to remove and may have deleterious effects on the semiconductor device as well as the chamber.

BRIEF SUMMARY OF THE INVENTION

Methods of removing etch residue from a substrate as well as from the interior surfaces of an etch process chamber are described. A plasma treatment transforms a metal on the substrate into metal byproducts that deposit on the wafer as well as the interior surfaces of the etch process chamber. Light emitting diodes are used to desorb the metal byproducts at a relatively low temperature so they can be removed from the substrate and the etch process chamber.

To better understand the nature and advantages of the present invention, reference should be made to the following description and the accompanying figures. It is to be understood, however, that each of the figures is provided for the purpose of illustration only and is not intended as a definition of the limits of the scope of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Certain embodiments of the present invention relate to an apparatus that is useful for the fabrication of semiconductor devices. While the present invention can be useful to produce a wide variety of semiconductor devices, some embodiments of the invention are particularly useful for producing semiconductor devices having metallic layers subtractively patterned with a plasma process, as described in more detail below. It is understood, however, that such a process may also be employed to subtractively pattern non-metallic layers and remove subsequent residues.

Figure 1:
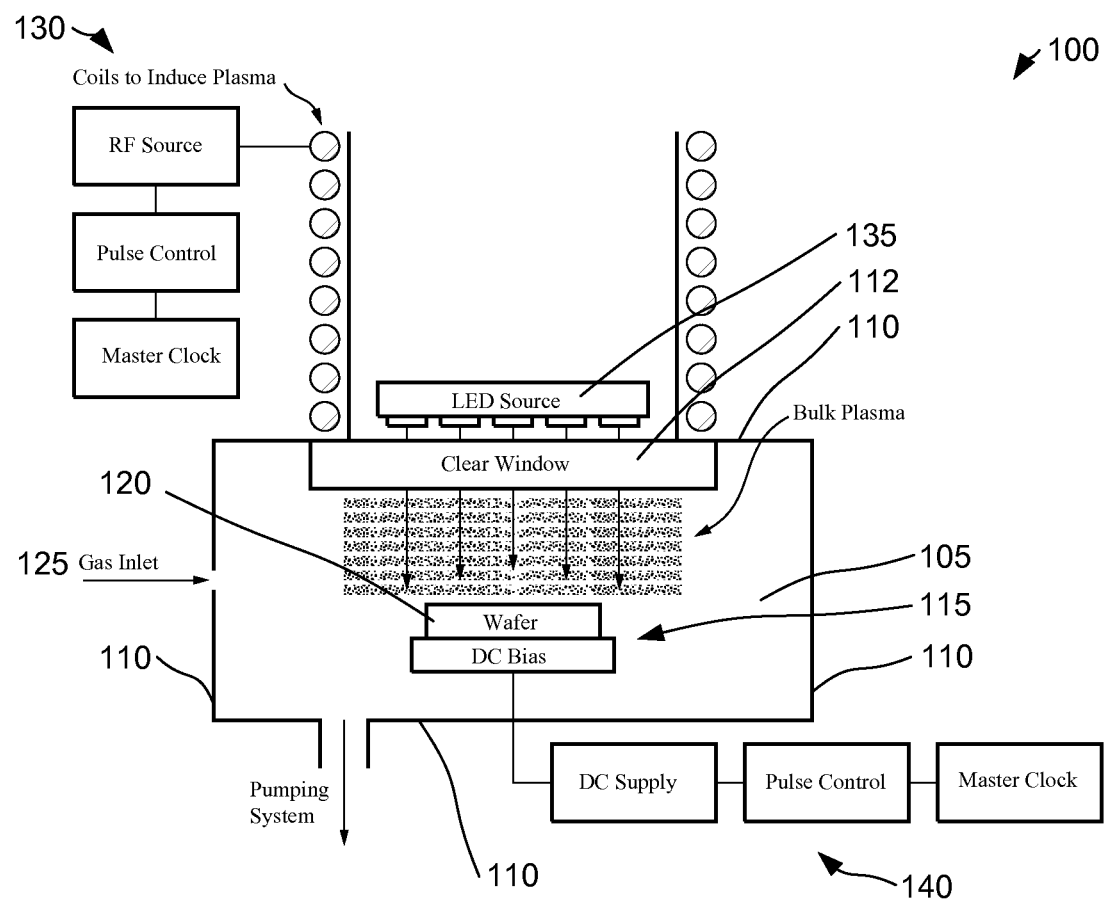
FIG. 1 is an example substrate processing system according to some embodiments.

FIG. 1 illustrates an example of a substrate processing system 100 that may be employed in an embodiment. Substrate processing system 100 has a substrate processing region 105 surrounded by one or more chamber walls 110. In one embodiment, at least one of chamber 110 walls is a window 112. A substrate support 115 is disposed within the substrate processing chamber and is configured to support a substrate 120 in substrate processing region 105 during a substrate processing operation. A gas delivery system 125 may be used to deliver one or more process gasses to substrate processing region 105. An inductively coupled plasma source 130 forms a plasma within the substrate processing chamber. In some embodiments the plasma source is a remote plasma source while in other embodiments it is an in-situ plasma source. In further embodiments the plasma source may be toroidal. A plurality of LEDs 135 are positioned outside the substrate processing chamber and configured to emit radiation into the substrate processing chamber through window 112. Substrate support 115 may be positioned directly opposite from and closely spaced to LEDs 135. A controller is coupled to the plasma source and plurality of LEDs 135. The controller is configured to sequentially pulse the plasma source and plurality of LEDs 135.

In some embodiments a biasing system 140 is configured to apply a bias between substrate 120 and an electrode. In further embodiments a DC or RF bias is used. In some embodiments the controller may sequentially pulse the plasma source, the LEDs and biasing system 140. Myriad pulsing sequences may be used including, but not limited to, the examples below. It is understood that not only the sequence of the pulses may be varied, but also the pulse duration, power and frequency. In one embodiment, by pulsing the three sources, seven different process conditions may be created:

1. Pulse Plasma
2. Pulse DC Biasing
3. Pulse LED Energy
4. Plasma+DC Biasing (RIE)
5. DC Biasing+LED Energy
6. Plasma+LED Energy (Conditioning Plasma/Altering Process Gasses)
7. Plasma+DC Biasing+LED Energy (LED Assisted Reactive Ion Etching (RIE))

These seven process conditions provide a novel solution to processing nonvolatile residues. The pulses may be changed in duration, amplitude, and/or order to achieve different lengths and magnitudes of each of the process conditions listed above. Each source may be pulsed or may operate continuously. Gases may also be introduced and may be pre-processed by UV light from the LEDs.

The plurality of LEDs may be of myriad configurations. In some embodiments, wavelengths may be in the UV, DUV, or EUV range. Other embodiments may have different wavelengths. In one embodiment the target wavelength may be 455 nm, so a range of 60 nm-500 nm may be used. For embodiments that are employed to etch copper, power densities in the range of 100 to 1,000,000 W/m$^2$ may be used. In some embodiments, wavelengths of 365 nm and a mercury arc lamp may be used. In further embodiments, power densities of 100,000 W/m$^2$ or more may be used. In some embodiments, to control the power of the LEDs, the input current and/or voltage may be monitored. In other embodiments a separate remote power sensor may be used.

In some embodiments one or more light pipes may be disposed at least partially between the LEDs and the window. The light pipes may be used to direct the light energy from the LEDs to the window. In further embodiments, one or more lenses may be disposed in the light path between the LEDs and the substrate. The lenses may be used to focus the LED light or scatter it. In one embodiment there is no window and the LEDs are located within the chamber. In other embodiments, LEDs of different wavelengths and/or power may be employed in a single substrate processing system. In one embodiment, LEDs having a first wavelength and power may be used for one chemical reaction while LEDs of a second wavelength and power may be used for a separate chemical reaction. In other embodiments, some LEDs may be used to promote a reaction in the plasma region adjacent to the substrate while other LEDs may be used to promote a reaction on the chamber walls, the window, or a different region within the chamber. In further embodiments an LED thermal management system may be configured to control the temperature of the plurality of LEDs. In one embodiment the LEDs may be maintained below 100 C.

Embodiments of the invention include methods of cleaning and/or preventing residue buildup on the window of the substrate processing chamber. In some embodiments a gas injector may be used to flow inert gas across the window. In other embodiments, residue on interior surfaces of the dielectric window may be transformed into a copper halogen layer during a first local plasma. The copper halogen layer may be desorbed as desorbed species from the dielectric window during a second local plasma which occurs after the first local plasma. In some embodiments the window may be maintained at a particular temperature to reduce or prevent residue build up. In one embodiment the temperature of the window may be maintained at approximately 65 C. Myriad other methods may be used to clean and/or prevent residue on the window.

In some embodiments the substrate processing system energizes specific precursors, process gases, and chemistries. By using the monochromatic properties of solid state sources (SSS) (e.g., LEDs, laser diodes, etc.) the chamber may be used to target the dissociation energy of a certain bond to break them in preparation for subsequent processes. In another embodiment, a separate source (plasma, heat, etc.) could dissociate the bond while the monochromatic light from the solid state source (such as LEDs) delivers energy to the dissociated reactants at a wavelength of their peak absorbance.

Processes with advanced chemistries may increase with the need for more precise control on gas phase reactions, byproducts, and surface reactions as the industry moves toward single-digit nanometer-sized features with exotic materials and interfaces. In some embodiments the substrate processing system may be tuned to a specific chemistry by selecting a SSS and using specific wavelengths to "tailor" or induce only the desired reactions for best control in reactors.

A few example reactions and processes are shown below. It is understood that these are examples only and the invention is not limited by these examples:

1. $Cl_2+Cu \rightarrow CuCl_2$ or CuCl. Then $CuCl_2$ or $CuCl+UV \rightarrow Cu_3Cl_3$ (a more volatile species of CuCl)
2. $Cu(s)+H_2(g) \rightarrow CuH$ (g)—or—$Cu(s)+H_2(g)+UV \rightarrow CuH$ (g). UV imparts more energy to help make more H+ to create CuH.
3. 2 Step Process involving $Cl_2+H_2+UV$:
   a. $Cl_2+Cu \rightarrow CuCl_2$ or CuCl.
   b. Then surface clean. $CuCl_2+H_2 \rightarrow CuH+Cu_xCl_x$—and/or—$CuCl+H_2 \rightarrow CuH+Cu_xCl_x$. UV may be added to create more volatile species of $Cu_xCl_x$.
4. $O_2$ plasma+$H_2O_2$ (hydrogen peroxide)+hfac (hexafluoroacetylacetone)/$C_2H_5OH$. In a similar way, Cu has been etched with hfac and $O_2$: Both Cu(I) and Cu(II) species may be etched according to the following reaction options:
   a. Option 1: $2Cu\ (s)+O \rightarrow Cu_2O(s)$ Then $Cu_2O+2H(hfac)(g) \rightarrow Cu(s)+Cu(hfac)2\ (g)+H_2O$ (g).
   b. Option 2: $Cu\ (s)+O \rightarrow CuO(s)$ Then $CuO+2H(hfac)(g) \rightarrow Cu(hfac)2\ (g)+H_2O$ (g).
   In some embodiments, the use of UV energy may play a role in volatilizing these compounds into gases quicker and cleaning the surfaces. In further embodiments, $O_2$ may also create a protection layer (passivation layer) that may be helpful.
5. $HCl+C_2H_2$: Research has shown that $H_2$ and Cl etch Cu. In some embodiments both $H_2$ and Cl may be added via HCL. Addition of an organic, $C_2H_2$ may result in higher CuH formation. In further embodiments, carbon may also create a protection layer for the copper which may be beneficial.
   a. An example reaction may be: $Cu(s)+HCl(g)+C_2H_2(g) \rightarrow CuH+Cu_xCl_x+C_x$ (some form of carbon containing species)
6. Two stage reactions:
   a. Oxidation Reactions
      i. $2Cu(s)+H_2O\ 2(g) => Cu_2O(s)+H_2O(g)$ and/or
      ii. $Cu(s)+H_2O\ 2(g) => CuO(s)+H_2O$ (g)
   b. Secondary Reactions
      i. $Cu_2O(s)+2hfacH(g) => Cu(s)+Cu(hfac)2(g)+H_2O$ (g) and/or
      ii. $CuO(s)+2hfacH(g) => Cu(hfac)z(g)+H_2O(g)$ In other embodiments, the etchant gas may comprise a halide, an oxidizer and/or a hydride. In further embodiments, any of these example reactions could use cobalt in place of copper. In still further embodiments, other metals may be used. In other embodiments, any of these example reactions could also be implemented at low and high temperatures (−50 to 350 C).

Depending on the chemistries involved, illuminating a surface in the presence of gas precursor can enhance the rate of chemical reactions by thermal or other means. For example, the light may excite gas phase molecules, adsorbed molecules, or even excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In further embodiments, the substrate processing system can be combined with existing plasma based reactors, as well as be incorporated into plasma chambers. In some embodiments the substrate processing system may consist, but shall not be limited by, any combination of the following:

1. An LED source, that can be pulsed or continuous, to dissociate process gases. This source could be monochromatic with wavelengths between 100 nm and 2000 nm or it could consist of multiple wavelengths.
2. A source for controlling the surface temperature of the wafer. This could include a pedestal that heats conductively, a light source (SSS or traditional), or resistive heating. The LED heat source could be used to heat the wafer surface in pulses of energy, or heat continuously.
3. A pulsed or continuous source to energize process gases after they have been dissociated. This source could be monochromatic with wavelengths between 100 nm and 2000 nm or it could consist of multiple wavelengths.
4. A pulsed or continuous plasma source to dissociate process gases with biasing power ranging from 100-2000 W, pulsing frequency of 1-60 MHz, and duty cycle of 10-90%.
5. A pulsed or continuous gas supply system. In some embodiments, individual gasses or a combination of gasses may be pulsed. In further embodiments individual gasses or a combination of gasses may be continuously supplied while in further embodiments some gasses may be continuously supplied while other gasses are pulsed.

In further embodiments, multiple LED sources could be used in the same chamber to perform various functions such as heating wafers, heating chamber walls, dissociation of precursors, excitation of reactants or byproducts, as well as chamber management, or other processes. Therefore, multiple LED and other sources could be placed in various locations in the chamber.

Thus, in some embodiments a substrate processing system combining a plasma source (ICP, CCP, remote, or microwave), a heating source (LED or conventional), and a new SSS capable of finely controlling reactions of the process gases may be used. Such a system may enable much finer control of advanced applications desired for future nodes of technology.

Figure 2:
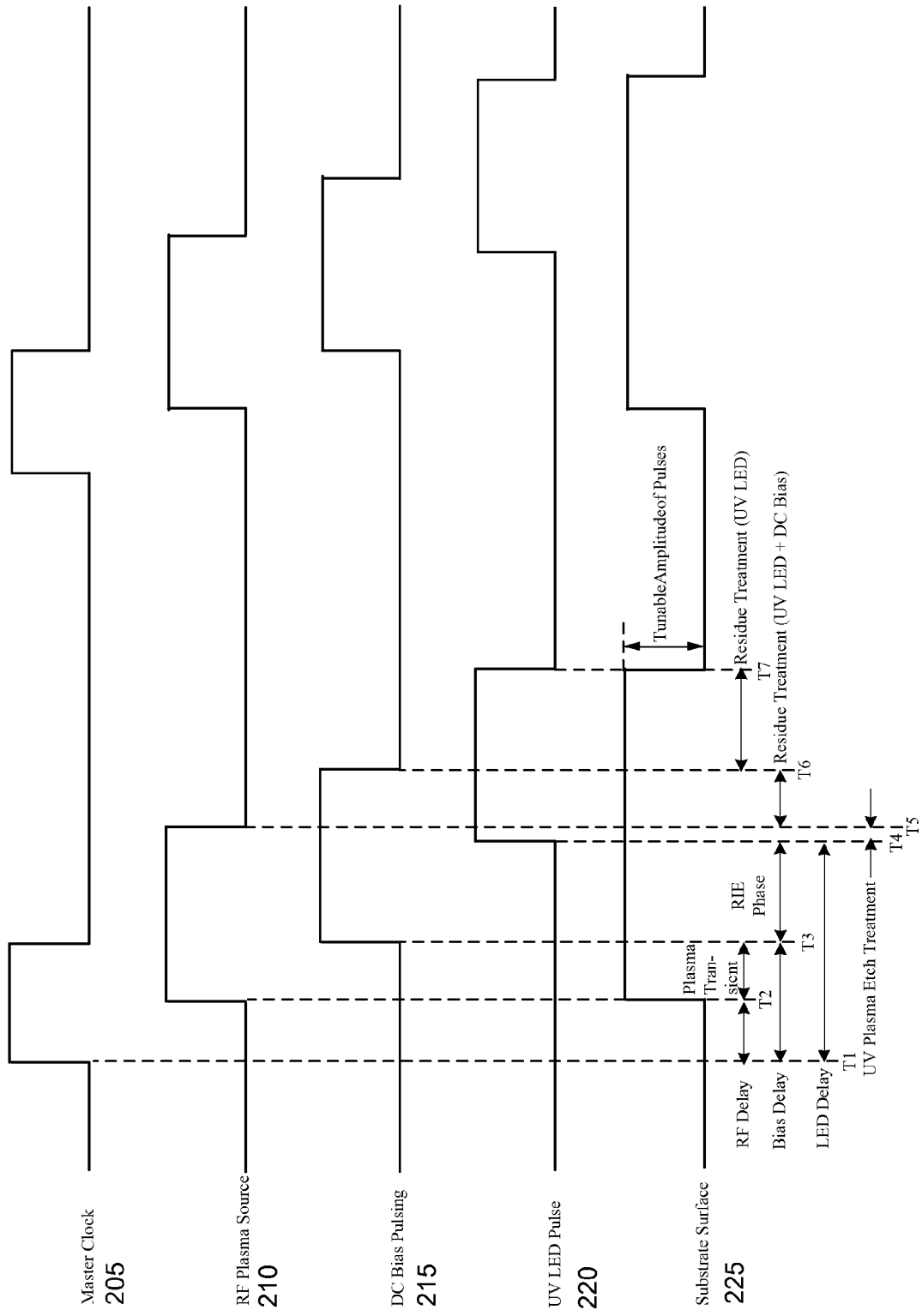
FIG. 2 is an example of a pulsed processing sequence for a substrate processing system according to some embodiments.

FIG. 2 illustrates an example embodiment of a processing system incorporating a pulsed RF plasma source 210, pulsed DC bias 215 and pulsed UV LEDs 220. Other embodiments may have other configurations. Master clock 205 may be used to synchronize the pulsing of the various systems. At time T1 master clock 205 initiates a pulse. At time T2, RF plasma source 210 turns on, activating a plasma within the chamber and etching the substrate surface. At time T3, DC bias 215 turns on, providing a DC bias between the substrate and an electrode. Thus, between time T2 and T3, a plasma transient occurs where the substrate is exposed to the plasma. At time T4 UV LEDs 220 are turned on. Thus, between time T3 and T4 the substrate is exposed to reactive ion etching (RIE) with a DC biased plasma. At time T5 RF plasma 210 shuts off. Thus, between time T4 and T5 a UV plasma etch treatment occurs. At time T6, DC bias 215 turns off. Thus, between time T5 and T6 residue treatment employing UV LED's and DC bias occurs. At time T7, UV LED pulse 220 turns off. Thus, between time T6 and T7 residue treatment employing UV LEDs 220 occurs. The amplitude of any of the pulses may be tuned to optimize the process. The overlay, delay and sequence of any of the pulses may be changed to further optimize the process.

Figure 3:
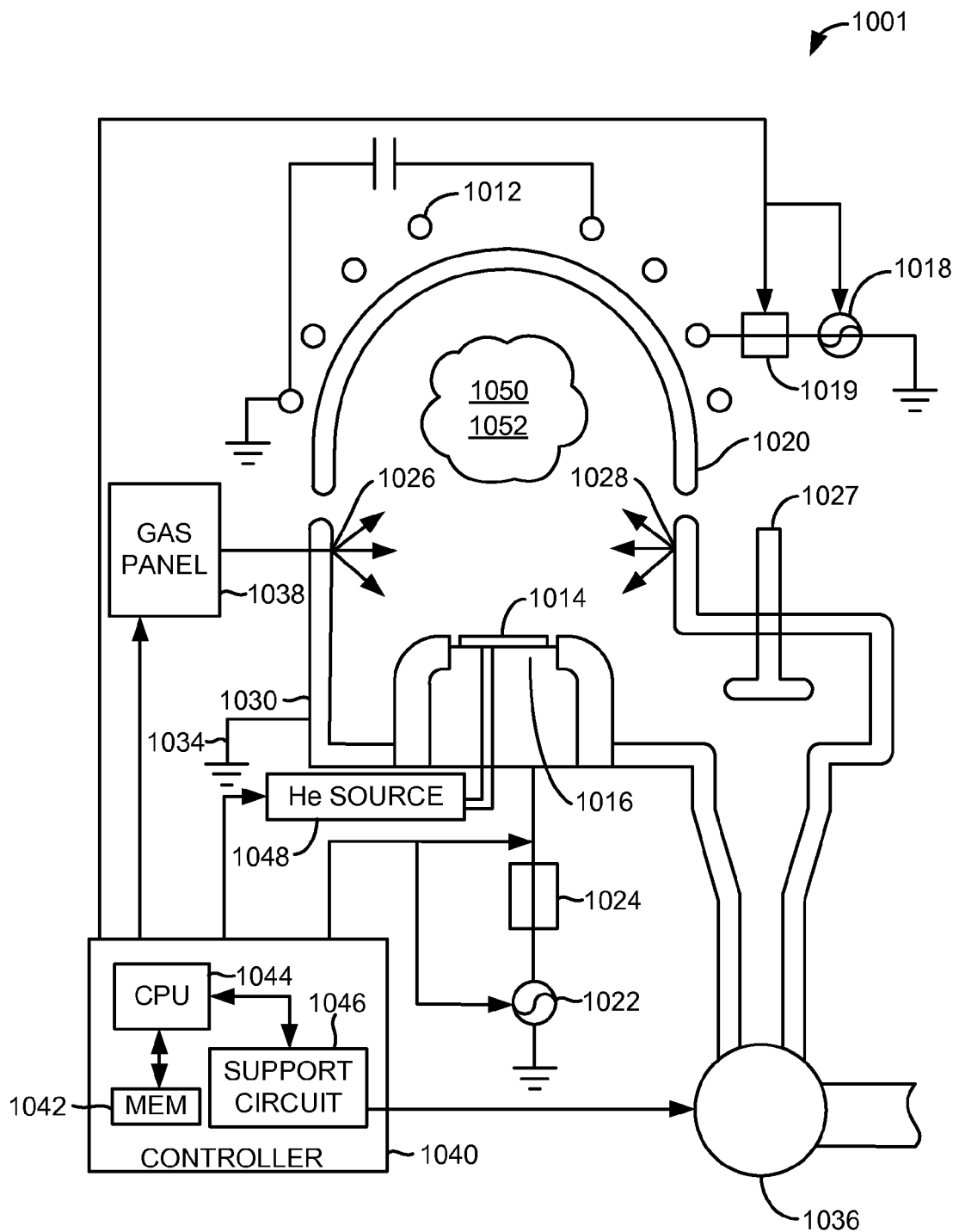
FIG. 3 is a schematic diagram of an etch process chamber which can be used to carry out processes according to some embodiments.

FIG. 3 depicts a schematic diagram of an example etch process chamber 1001 that may be used in an embodiment. Etch process chamber 1001 may be incorporated into a substrate processing system 1101 described later with reference to FIG. 4. Example etch process chamber 1001 may also be referred to as a decoupled-plasma source chamber or DPS chamber. Etch process chamber 1001 includes inductive coils 1012, positioned exterior to a dielectric, dome-shaped ceiling 1020 (referred to herein as the dome 1020). Other chambers may have other types of ceilings, e.g., a flat ceiling. Inductive coil 1012 can be coupled to a radio-frequency (RF) source 1018 (that is generally capable of producing an RF signal having a tunable frequency). RF source 1018 is coupled to inductive coil 1012 through a matching network 1019. Etch process chamber 1001 can include a substrate support pedestal (cathode) 1016 that is coupled to a second RF source 1022 that is generally capable of producing an RF signal. RF source 1022 can be coupled to pedestal 1016 through a matching network 1024. Etch process chamber 1001 may also contain a conductive chamber wall 1030 that is connected to an electrical ground 1034. In other embodiments process chamber 1001 may employ a DC biasing network. Further embodiments of process chamber 1001 may generate a plasma using other variations such as a toroidal source, inductive coils located around walls 1030 or other configurations. A controller 1040 including a central processing unit (CPU) 1044, a memory 1042, and support circuits 1046 for a CPU 1044 is coupled to various components of etch process chamber 1001 to facilitate control of the etch process.

In operation, a semiconductor substrate 1014 is placed on pedestal 1016 and gaseous components are supplied from a gas handling system 1038 to etch process chamber 1001 through entry port(s) 1026 to form a gaseous mixture 1050. Gaseous mixture 1050 is ignited into a plasma 1052 in etch process chamber 1001 by applying RF power from RF sources 1018 and 1022 respectively to inductive coil 1012 and pedestal 1016. The pressure within the interior of etch process chamber 1001 is controlled using a throttle valve 1027 situated between etch process chamber 1001 and a vacuum pump 1036. The temperature at the surface of chamber wall 1030 is controlled using liquid-containing conduits (not shown) that are located in chamber wall 1030 of etch process chamber 1001. The temperature at the surface of dome 1020 may also be controlled using a circulating liquid or other means.

The temperature of substrate 1014 is controlled by stabilizing the temperature of pedestal 1016 and flowing helium gas from a helium source 1048 to channels formed by the back of substrate 1014 and grooves (not shown) on the pedestal surface. The helium gas is used to facilitate heat transfer between pedestal 1016 and substrate 1014. During the etch process, substrate 1014 is heated by a resistive heater within the pedestal to a steady state temperature and the helium facilitates uniform heating of substrate 1014. Using thermal control of both dome 1020 and pedestal 1016, substrate 1014 is maintained at a temperature of between about −200° C. and about 500° C.

Figure 4:
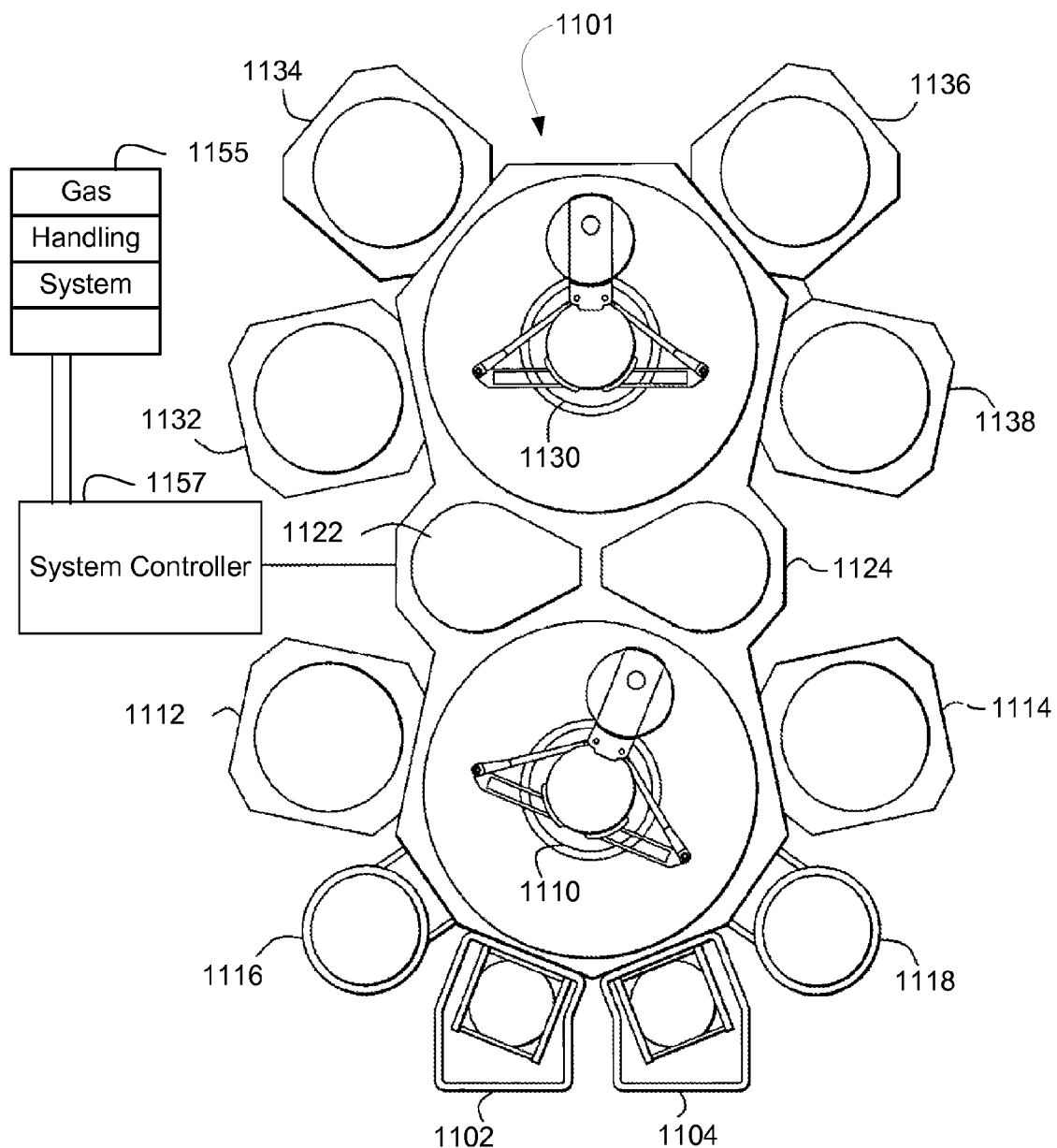
FIG. 4 is a schematic top-view diagram of an exemplary multi-chamber substrate processing system which can be used to carry out processes according to some embodiments.

FIG. 4 is a schematic top-view diagram of an illustrative multi-chamber processing system 1101. The processing system 1101 can include one or more load lock chambers 1102, 1104 for transferring of substrates into and out of the processing system 1101. Typically, since the processing system 1101 is under vacuum, the load lock chambers 1102, 1104 may "pump down" the substrates introduced into the processing system 1101. A first robot 1110 may transfer the substrates between the load lock chambers 1102, 1104, and a first set of one or more substrate processing chambers 1112, 1114, 1116, 1118 (four are shown). Each processing chamber 1112, 1114, 1116, 1118, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 1110 can also transfer substrates to/from one or more transfer chambers 1122, 1124. The transfer chambers 1122, 1124 can be used to maintain ultrahigh vacuum conditions while allowing substrates to be transferred within the processing system 1101. A second robot 1130 can transfer the substrates between the transfer chambers 1122, 1124 and a second set of one or more processing chambers 1132, 1134, 1136, 1138. Similar to processing chambers 1112, 1114, 1116, 1118, the processing chambers 1132, 1134, 1136, 1138 can be outfitted to perform a variety of substrate processing operations including the UV LED etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 1112, 1114, 1116, 1118, 1132, 1134, 1136, 1138 may be removed from the processing system 1101 if not necessary for a particular process to be performed by the processing system 1101. A copper etch processing chamber for carrying out the methods described herein may be installed in any one or more of substrate processing chamber locations.

System controller 1157 is used to control motors, valves, flow controllers, power supplies and other functions required to carry out process recipes described herein. System controller 1157 may rely on feedback from optical sensors to determine and adjust the position of movable mechanical assemblies. Mechanical assemblies may include the robot, throttle valves and susceptors which are moved by motors under the control of system controller 1157. A gas handling system 1155 is used to deliver halogen-containing precursors and inert species at various stages during the methods described herein.

In an example embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains processing chamber 400 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A substrate processing system, comprising:
   a substrate processing chamber having a substrate processing region surrounded by one or more chamber walls;
   a substrate support configured to support a substrate having a metal layer in the substrate processing region during a substrate processing operation;
   a gas delivery system configured to deliver one or more process gasses including an etching gas for etching the metal layer to the substrate processing region;
   a plasma source operatively coupled to the substrate processing chamber;
   a window positioned on one of the one or more chamber walls;
   a plurality of LEDs positioned outside the substrate processing chamber and configured to emit radiation into the chamber through the window, or positioned within the substrate processing chamber;
   a controller operatively coupled to the plasma source and the plurality of LEDs, the controller configured to generate a series of pulses for the plasma source and a series of pulses for the plurality of LEDs, wherein, in each clock period, a start of a pulse for the plurality of LEDs is during a pulse for the plasma source, and an end of the pulse for the plurality of LEDs is after the pulse for the plasma source; and
   a biasing system configured to apply a bias between the substrate and an electrode, wherein the controller is further configured to generate a series of pulses for the biasing system, and wherein, in each clock period, an end of a pulse for the biasing system is after the pulse for the plasma source but before the end of the pulse for the plurality of LEDs.

2. The substrate processing system of claim 1 further comprising light pipes disposed at least partially between the plurality of LEDs and the window, the light pipes configured to direct light from the plurality of LEDs to the window.

3. The substrate processing system of claim 1 further comprising a lens disposed between the plurality of LEDs and the substrate support, the lens configured to focus or scatter light energy from the plurality of LEDs.

4. The substrate processing system of claim 1 wherein the plurality of LEDs comprises a first set of LEDs having a first wavelength and a second set of LEDs having a second wavelength different from the first wavelength.

5. The substrate processing system of claim 1 wherein the substrate support is positioned directly opposite from the plurality of LEDs.

6. The substrate processing system of claim 1 further comprising an LED thermal management system configured to control a temperature of the plurality of LEDs.

7. The substrate processing system of claim 1 further comprising a gas injector configured to flow an inert gas across the window.

8. The substrate processing system of claim 1 wherein the plasma source is a remote plasma source.

9. The substrate processing system of claim 1 wherein the plasma source is an in-situ plasma source.

10. The substrate processing system of claim 1 wherein the plurality of LEDs are positioned within the substrate processing chamber.

11. A semiconductor manufacturing system configured to etch a metal layer on a semiconductor substrate, the system comprising:
    a semiconductor substrate processing region surrounded by a plurality of walls;
    a window disposed in one of the plurality of walls;
    a plurality of LEDs disposed outside of the semiconductor substrate processing region, the plurality of LEDs configured to emit UV radiation through the window into the semiconductor substrate processing region;
    a plasma source configured to form a plasma in the semiconductor substrate processing region;
    a controller coupled to the plasma source and the plurality of LEDs, the controller configured to generate a series of pulses for the plasma source and a series of pulses for the plurality of LEDs, wherein, in each clock period, a start of a pulse for the plurality of LEDs is during a pulse for the plasma source, and an end of the pulse for the plurality of LEDs is after the pulse for the plasma source; and
    a biasing system configured to apply a bias between the substrate and an electrode, wherein the controller is further configured to generate a series of pulses for the biasing system, and wherein, in each clock period, an end of a pulse for the biasing system is after the pulse for the plasma source but before the end of the pulse for the plurality of LEDs.

12. The semiconductor manufacturing system of claim 11 further comprising a sensor configured to monitor at least one of a power, a current, or a voltage of the plurality of LEDs.

13. The semiconductor manufacturing system of claim 11 further comprising light pipes disposed at least partially between the plurality of LEDs and the window, the light pipes configured to direct light from the plurality of LEDs to the window.

14. The semiconductor manufacturing system of claim 11 further comprising a lens disposed between the plurality of LEDs and the semiconductor substrate processing region, the lens configured to focus or scatter the UV radiation.

15. The semiconductor manufacturing system of claim 11 wherein the plurality LEDs comprises a first set of LEDs having a first wavelength and a second set of LEDs having a second wavelength different from the first wavelength.

16. The semiconductor manufacturing system of claim 11 wherein the plurality of LEDs has a wavelength between 60 nm and 500 nm.

17. The semiconductor manufacturing system of claim 11 wherein the plurality of LEDs has a wavelength of 365 nm.

18. The semiconductor manufacturing system of claim 11 wherein the plurality of LEDs has a power density between 100 and 1,000,000 $W/m^2$.

* * * * *